United States Patent
Bacigalupo et al.

(10) Patent No.: US 10,126,353 B2
(45) Date of Patent: Nov. 13, 2018

(54) VERIFICATION OF GATE DRIVER PROTECTION LOGIC

(71) Applicant: Infineon Technologies AG, Neubiberg (DE)

(72) Inventors: Tommaso Bacigalupo, Fuerstenfeldbruck (DE); Marco Bachhuber, Neuried (DE); Marcus Nuebling, Olching-Esting (DE); Laurent Beaurenaut, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 240 days.

(21) Appl. No.: 14/665,927

(22) Filed: Mar. 23, 2015

(65) Prior Publication Data

US 2016/0282407 A1 Sep. 29, 2016

(51) Int. Cl.
  *G01R 31/3187* (2006.01)
  *G01R 31/26* (2014.01)
  *G05F 1/00* (2006.01)
  *H01L 21/00* (2006.01)

(52) U.S. Cl.
  CPC ...... *G01R 31/2621* (2013.01); *G01R 31/3187* (2013.01); *G05F 1/00* (2013.01); *H01L 21/00* (2013.01); *H01L 2221/00* (2013.01)

(58) Field of Classification Search
  CPC ...... H01L 21/00; H01L 2221/00; H02M 1/00; G05F 1/00; G06Q 10/00; G06Q 2220/00
  See application file for complete search history.

(56) References Cited

U.S. PATENT DOCUMENTS

| | | | | |
|---|---|---|---|---|
| 7,932,622 | B2* | 4/2011 | Chiozzi | H03K 17/04106 307/10.1 |
| 8,657,489 | B2* | 2/2014 | Ladurner | H03K 17/14 361/103 |
| 9,891,265 | B2* | 2/2018 | Hirose | G01R 31/2621 |
| 2007/0016340 | A1* | 1/2007 | Soudier | B60L 3/0084 701/1 |
| 2008/0062602 | A1* | 3/2008 | Raimondi | H03K 17/0822 361/78 |

(Continued)

FOREIGN PATENT DOCUMENTS

CN 104009445 A 8/2014

OTHER PUBLICATIONS

"Advanced IGBT/MOSFET Driver," STMicroelectronics, Data Sheet TD350, Rev. 2.4, Jan. 2003, 10 pp.

(Continued)

*Primary Examiner* — Jermele M Hollington
*Assistant Examiner* — Temilade Rhodes-Vivour
(74) *Attorney, Agent, or Firm* — Shumaker & Sieffert, P.A.

(57) ABSTRACT

A gate driver is described that includes a gate signal module configured to output a gate signal of the gate driver for driving a gate terminal of a semiconductor device. The gate driver further includes a test module configured to generate a simulated failure condition at a semiconductor device during a test of a monitoring and protection feature of the gate driver. The gate drier further includes a monitor module configured to output an indication of the simulated failure condition in response to detecting the simulated failure condition at the semiconductor device.

20 Claims, 6 Drawing Sheets

(56) References Cited

U.S. PATENT DOCUMENTS

| | | | |
|---|---|---|---|
| 2013/0181729 A1* | 7/2013 | Egan | G01R 31/40 324/750.01 |
| 2014/0077782 A1* | 3/2014 | Cortigiani | H03K 17/0822 323/284 |
| 2014/0118874 A1* | 5/2014 | Kandah | H03K 17/0826 361/93.1 |
| 2014/0139206 A1* | 5/2014 | Hirose | G01R 1/06766 324/132 |
| 2014/0218097 A1* | 8/2014 | Barrenscheen | H02M 3/3376 327/379 |
| 2016/0118976 A1* | 4/2016 | Boianceanu | H03K 17/145 327/427 |

OTHER PUBLICATIONS

"Single IGBT Gate Driver," On Semiconductor Components Industries, Data Sheet MC33153/D, Rev. 8, Aug. 2013, 14 pp.

Office Action, in Chinese language, from counterpart Chinese Application No. 201610162430.2, dated Dec. 21, 2017, 7 pps.

\* cited by examiner

VERIFICATION OF GATE DRIVER PROTECTION LOGIC

BACKGROUND

Some systems rely on semiconductor modules that are made up of one or more insulated-gate bipolar transistor (IGBT) devices, metal-oxide-semiconductor field-effect-transistor (MOSFET) devices, or other types of transistor based devices. Some systems will drive the device gate(s) of a semiconductor module using a specialized gate driver integrated circuit device (IC) that includes fault condition monitoring and/or protection features to prevent the module from being damaged during a fault condition (e.g., accidental short circuit, an over temperature condition, an overvoltage condition, an overcurrent condition, or other fault condition).

For example, a high power automotive drive train typically includes one or more semiconductor modules that act as power switches to control the flow of electrical power to and from an engine. The gate drivers of the semiconductor modules of the drive train may include desaturation protection features, overcurrent protection features, or other types or fault monitoring features that remain active at all times. In the event that the monitoring features identify a fault condition, an engine controller can take action (e.g., open or close a switch) to prevent the fault condition from damaging the semiconductor module.

To ensure compliance with safety requirements (e.g., as per ISO standard 26262), some systems may occasionally (e.g., when starting an automobile) intentionally introduce actual system level failures into the system. Introducing actual system level failures provides a way for some systems to exercise and verify functionality of fault monitoring and protection features in the event that unintentional failures do occur. For example, some systems include additional hardware (e.g., at the printed circuit board level) that, at a risk of damaging the system, injects out of range currents into the system so as to occasionally trigger the overcurrent monitoring and protection features. Additional hardware such as this may increase size, cost, and/or complexity of a system and also risk damaging the system in the event that the protection features fail.

SUMMARY

In general, circuits and techniques are described for enabling a gate driver to test the performance of internal fault monitoring features without requiring system level, electrical excitation by an external, fault triggering circuitry. An example gate driver includes a fault monitoring module (e.g., overcurrent monitoring module, a desaturation monitoring module, or other module or feature that provides fault monitoring). Rather rely on specialized hardware to induce actual failure conditions into the system, the example gate driver includes a test module configured to simulate failure conditions that if detected by the fault monitoring module, can verify the functionality of the fault monitoring module. In this way, a system can verify that a fault monitoring module of a gate driver is working, without relying specialized hardware to induce actual failure conditions into the system and without risking damaging the system if the fault monitoring and protection features fail.

In one example, the disclosure is directed to a gate driver that includes a gate signal module configured to output a gate signal of the gate driver for driving a gate terminal of a semiconductor device, a test module configured to generate a simulated failure condition at a semiconductor device during a test of a monitoring and protection feature of the gate driver, and a monitor module configured to output an indication of the simulated failure condition in response to detecting the simulated failure condition at the semiconductor device.

In another example, the disclosure is directed to a method for testing of a monitoring and protection feature of a gate driver. The method comprises initiating, by a control module, a test of the monitoring and protection feature of the gate driver during which the gate driver simulates a failure condition associated with a semiconductor device, and responsive to receiving an indication of an error being output by the gate driver in response to the simulated failure condition, measuring, by the control module, an amount of time for the gate driver to output the indication of the error after initiating the test. The method may further include comparing, by the control module, the measured amount of time to an expected time threshold; and responsive to determining the measured amount of time does not satisfy the expected time threshold, determining that a failure of the monitoring and protection feature of the gate driver occurred.

In another example, the disclosure is directed to a computer-readable storage medium comprising instructions that, when executed, configure at least one processor of a control module to test a monitoring and protection feature of a gate driver by at least initiating a test of the monitoring and protection feature of the gate driver during which the gate driver simulates a failure condition associated with a semiconductor device, and responsive to receiving an indication of an error being output by the gate driver in response to the simulated failure condition, measure an amount of time for the gate driver to output the indication of the error after initiating the test. The instructions, when executed, further configured the at least one processor of the control module to test the monitoring and protection feature of the gate driver by at least comparing the measured amount of time to an expected time threshold, and responsive to determining the measured amount of time does not satisfy the expected time threshold, determining that a failure of the monitoring and protection feature of the gate driver occurred.

The details of one or more examples are set forth in the accompanying drawings and the description below. Other features, objects, and advantages of the disclosure will be apparent from the description and drawings, and from the claims.

DETAILED DESCRIPTION

Figure 1:
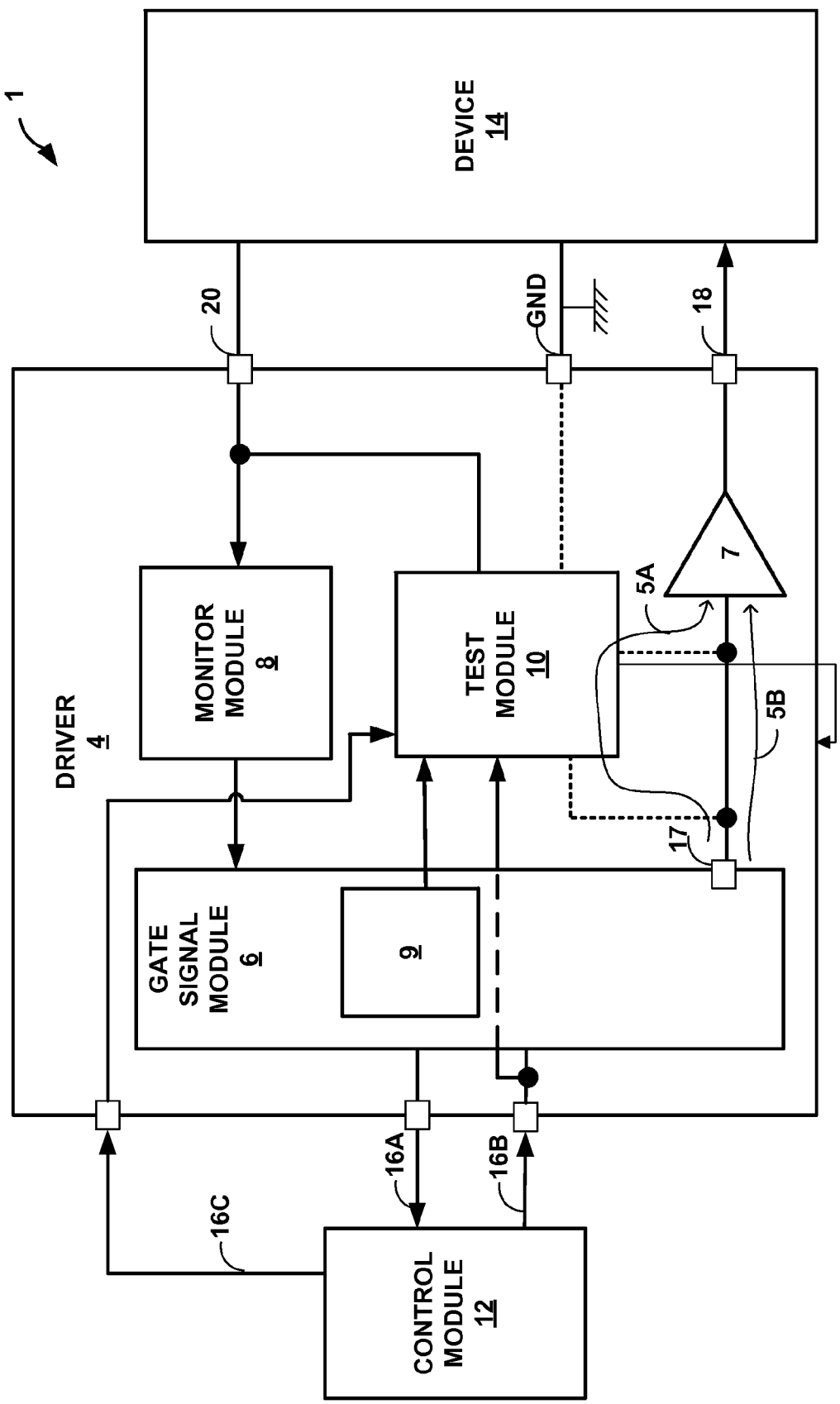
FIG. 1 is a conceptual diagram illustrating a system that includes an example gate driver configured to test the internal protection logic of the gate driver, in accordance with one or more aspects of the present disclosure.

FIG. 1 is a conceptual diagram illustrating system 1 including gate driver 4 which is configured to test the internal protection logic of driver 4, in accordance with one or more aspects of the present disclosure. In addition to driver 4, system 1 includes control module 12, and device 14.

System 1 represents any example system that includes one or more semiconductor modules or "devices" being driven by gate drivers that include monitoring and/or protection features to prevent the semiconductor modules from being damaged during a fault condition (e.g., accidental short circuit, an over temperature condition, an overvoltage condition, an overcurrent condition, or other fault condition). For example, system 1 may be an automotive system (e.g., a lighting system, a drive train system, or other automotive system), an electrical power and distribution system, a computer system, a power conversion system, or any other system that includes one or more semiconductor components at risk of suffering from failure conditions and drivers configured to protect the semiconductor components from the failure conditions.

Device 14 is a semiconductor module that is driven by a gate driver, such as driver 4. Device 14 may include one or more insulated-gate bipolar transistor (IGBT) devices, metal-oxide-semiconductor field-effect-transistor (MOSFET,) devices, or other types of transistor based devices that have gates configured to receive a gate signal from a driver. In some examples, device 14 is a power switch and configured to conduct a current through a forward conduction channel when device 14 is driven "on". Device 14 may be configured to refrain from conducting through the forward conduction channel when device 14 is driven "off."

Device 14 may receive a gate signal via link 18 that drives a gate terminal of one or more of the transistor based devices of device 14. Device 14 may output feedback information via link 20 that driver 4 and/or control module 12 may use to determine whether device 14 is functioning properly. For example, device 14 may output a voltage level or a current level via link 20 in response to receiving a gate signal via link 18. Driver 4 and/or control module 12 may compare the voltage level or current level at link 20 to an expected voltage or current level (e.g., a threshold) to determine whether device 14 is functioning properly and/or whether a failure condition is occurring at device 14. In some examples, as shown in FIG. 1, device 14 is electrically coupled to driver 4 at a ground or common terminal.

Control module 12 exchanges command and control signals with driver 4 to cause device 14 to perform an operation. For example, control module 12 may output a gate control signal via link 16B that in-turn, causes driver 4 to output a gate signal at link 18 (e.g., for driving device 14 "on" or "off"). Control module 12 may receive an error feedback signal via link 16A in response to monitoring and protection features of driver 4 reporting the detection of a failure condition associated with driver 4 and/or device 14. In some examples, control module 12 may output a gate control signal via link 16B that signals driver 4 to switch device 14 from being "switched-off" (e.g., and not conducting through a conduction channel) to being "switched-on" (e.g., and forward conducting) or vice versa.

Control module 12 may comprise any suitable arrangement of hardware, software, firmware, or any combination thereof, to perform the techniques attributed to control module 12 herein. For example, control module 12 may include any one or more microprocessors, digital signal processors (DSPs), application specific integrated circuits (ASICs), field programmable gate arrays (FPGAs), or any other equivalent integrated or discrete logic circuitry, as well as any combinations of such components. When control module 12 includes software or firmware, control module 12 further includes any necessary hardware for storing and executing the software or firmware, such as one or more processors or processing units.

In general, a processing unit may include one or more microprocessors, DSPs, ASICs, FPGAs, or any other equivalent integrated or discrete logic circuitry, as well as any combinations of such components. Although not shown in FIG. 1, control module 12 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to control module 12 e.g., may be external to a package in which control module 12 is housed.

In some examples, control module 12 may output a test signal to driver 4 via link 16C that triggers driver 4 to test the monitoring and protection features of driver 4. For example, to verify that driver 4 is adequately monitoring driver 4 and/or device 14 for potential failure conditions of system 1 and also correctly reporting any failure conditions back to system 1, control module 12 may output a test signal via link 16C that signals driver 4 to perform a verification test of the monitoring and protection features of driver 4. In response to the test signal, control module 12 may receive one or more feedback signals from driver 4 via link 16A that indicate whether monitor module 8 detected a failure condition, in response to the test.

Driver 4 is an example driver configured to test the performance of internal fault monitoring features without requiring system level, electrical excitation. Driver 4 includes gate signal module 6, output buffer 7, monitor module 8, and test module 10. Gate signal module 6 includes blanking counter 9. Driver 4 may include additional or fewer modules and components than what are shown in FIG. 1. In some examples, driver 4 and device 14 are a single unit. In other examples, as shown in FIG. 1, driver 4 and device 14 are separate, distinct modules linked by links 18, 20, and a common GND.

Modules 6-10 may comprise any suitable arrangement of hardware, software, firmware, or any combination thereof, to perform the techniques attributed to modules 6-10 herein. For example, modules 6-10 may include any one or more microprocessors, DSPs, ASICs, FPGAs, or any other equivalent integrated or discrete logic circuitry, as well as any combinations of such components. When modules 6-10 include software or firmware, modules 6-10 further include any necessary hardware for storing and executing the software or firmware, such as one or more processors or processing units.

As is the case with a processing unit of control module 12, a processing unit of any of modules 6-10 may include one or more microprocessors, DSPs, ASICs, FPGAs, or any other equivalent integrated or discrete logic circuitry, as well as any combinations of such components. Although not shown in FIG. 1, modules 6-10 may include a memory configured to store data. The memory may include any volatile or non-volatile media, such as RAM, ROM, NVRAM, EEPROM, flash memory, and the like. In some examples, the memory may be external to modules 6-10 and/or driver 4, e.g., may be external to a package in which modules 6-10 and/or driver 4 are housed.

Gate signal module 6 (referred to simply as GSM 6) is configured to cause driver 4 to output a gate signal, via output buffer 7 and link 18, to device 14 based on the information received from control module 12. For example, GSM 6 may receive a gate control signal from control module 12 and cause driver 4 to output a corresponding gate signal at link 18.

Gate signal module 6 may also be configured to relay error information to control module 12, via link 16A, that indicates whether the monitoring features of driver 4 have detected any potential failure conditions associated with driver 4, device 14, and/or system 1. For example, GSM 6 may receive information from monitor module 8 when monitor module 8 detects an overcurrent condition, a desaturation condition, or other failure condition at link 20. GSM 6 may provide control module 12 with an error signal in response to monitor module 8 detecting the failure condition. Based on the error signal received from driver 4, control module 12 may take action to prevent the failure condition from damaging device 14 and/or driver 4. In some examples, rather than output the error signal to control module 12, driver 4 itself may react on the failure condition. For instance, gate signal module 6 may configure driver 4 to operate in a "safe state" or "safe mode" to protect device 14 from damage from the failure condition.

As is described below with respect to the additional FIGS., in some examples, when test module 10 is disabled, the gate signal being output by GSM 6 may follow signal path 5B, traveling from GSM 6, via link 17, directly to buffer 7, and out via link 18, to device 14. However in other examples, when test module 10 is enabled, the gate signal being output by GSM 6 may follow path 5A and travel out of GSM module 6 and through test module 10 before traveling on to buffer 7 and out to device 14 via link 18.

In addition to outputting a gate signal via link 17, GSM module 6 includes blanking counter 9. Although described throughout this disclosure as being a "counter", blanking counter 9 and the other counters described herein may be "classical" digital counters or may be other equivalent analog delay lines (e.g. configured with some external resistive/capacitive elements). The purpose of blanking counter 9 is to provide monitor module 8 with sufficient amount of time (i.e., a blanking period) to determine whether device 14 is experiencing a failure condition, before GSM module 6 analyzes the information received from monitor module 8 for any detected failures. In other words, blanking counter 9 prevents errors from erroneously being received by GSM module 6 during a transition phase of gate control signal at link 16B when monitor module 8 may not necessarily be accurately detecting failure conditions.

In some examples, blanking counter 9 may reset (e.g., reload its initial count and start counting) after the gate control signal from control module 12 transitions from "off" to "on" or vice versa. When blanking counter elapses (e.g., counts down to zero or counts up to a maximum count), GSM module 6 may analyze the information received from monitor module 8 and report out via link 16A whether driver 4 detects any failure conditions. Prior to blanking counter elapsing however, GSM module 6 may disregard the information received from monitor module 8 and report out that no failure conditions are detected. In other words, blanking counter 9 may provide GSM module 6 with a defined blanking window that otherwise masks any anomalies in the errors detected by monitor module 8 during the transition phase of a gate control signal received by control module 12.

Monitor module 8 of driver 4 represents a component for providing failure condition monitoring features to driver 4. In some examples, monitor module 8 is a desaturation detection module. In some examples, monitor module 8 is an overcurrent detection module. In any event, monitor module 8 receives information via link 20 about the operating conditions associated with device 14 (e.g., voltage level or current level). Based on the operating conditions associated with device 14, monitor module 8 outputs an error or feedback signal to GSM module 6. GSM module 6 analyzes the information received from monitor module 8 to determine whether a reportable failure condition is or is about to occur at device 14.

Test module 10 tests the performance of monitor module 8 without requiring control module 12 to initiate a system level, electrical excitation of driver 4 and/or device 14 (e.g., by an external, fault triggering circuitry). In other words, rather than rely on specialized hardware to induce actual failure conditions into system 1, driver 4 includes test module 10 which is configured to simulate failure conditions that if detected by monitor module 8, verify that monitor module 8 is working properly. In this way, driver 4 and system 1 can verify that the fault monitoring and protection features of driver 4 are working, without relying specialized hardware to induce actual failure conditions into system 1 and without risking damaging system 1 if the fault monitoring and protection features of driver 4 fail.

Test module 8 may be enabled by control module 12. Control module 12 may send information via link 16C that causes test module 10 to initiate a test of monitor module 8. In response to the information from control module 12, test module 10 may simulate a failure condition at link 20. For instance, in some examples, test module 10 may force the gate signal being output by GSM module 6 at link 17 to take signal path 5A through test module 10 so that test module 10 can modify the gate signal before outputting the gate signal to buffer 7 to perform the test. In some examples, test module 10 may conduct a test of monitor module 8 by coupling link 20 to GND or VCC to simulate a failure condition at device 14.

In any case, by simulating the failure condition at device 14, test module 10 may enable control module 12 to determine whether monitor module 8 and driver 4 are correctly reporting a failure condition or not. In some examples, after simulating a failure condition at link 20, monitor module 8 may detect the failure condition and output an error indication to GSM module 6. GSM module 6 may report out the failure condition to control module 12 via link 16A. After enabling test module 10, control module 12 may validate the functionality of the monitoring and protection features of driver 4 depending on whether control module 12 receives an indication of a failure condition or not.

In this way, system 1 may ensure compliance with safety requirements (e.g., as per ISO standard 26262) without having to exercise the fault protection features of driver 4 and device 14 with actual failure conditions. Instead, control module 12 can test the monitoring and protection features of system 1 simply by enabling test module 10 to simulate a failure condition at driver 4 and device 14 and perform a test. In this way, system 1 does not need any specialized hardware (e.g., at the printed circuit board level) designed to inject out of range currents or otherwise induce failure conditions designed to trigger the fault monitoring and protection features of driver 4. As a result of not having the additional hardware to inject failures at system 1, system 1 may cost less, be smaller in size, and/or less complex than other systems. In addition, by performing tests using a simulated failure condition rather than an actual failure condition (e.g., an injected overcurrent), system 1 does not risk damaging driver 4 and/or device 14 in the event that the monitoring and protection features (e.g., monitor module 8) of driver 4 do fail.

Figure 2:
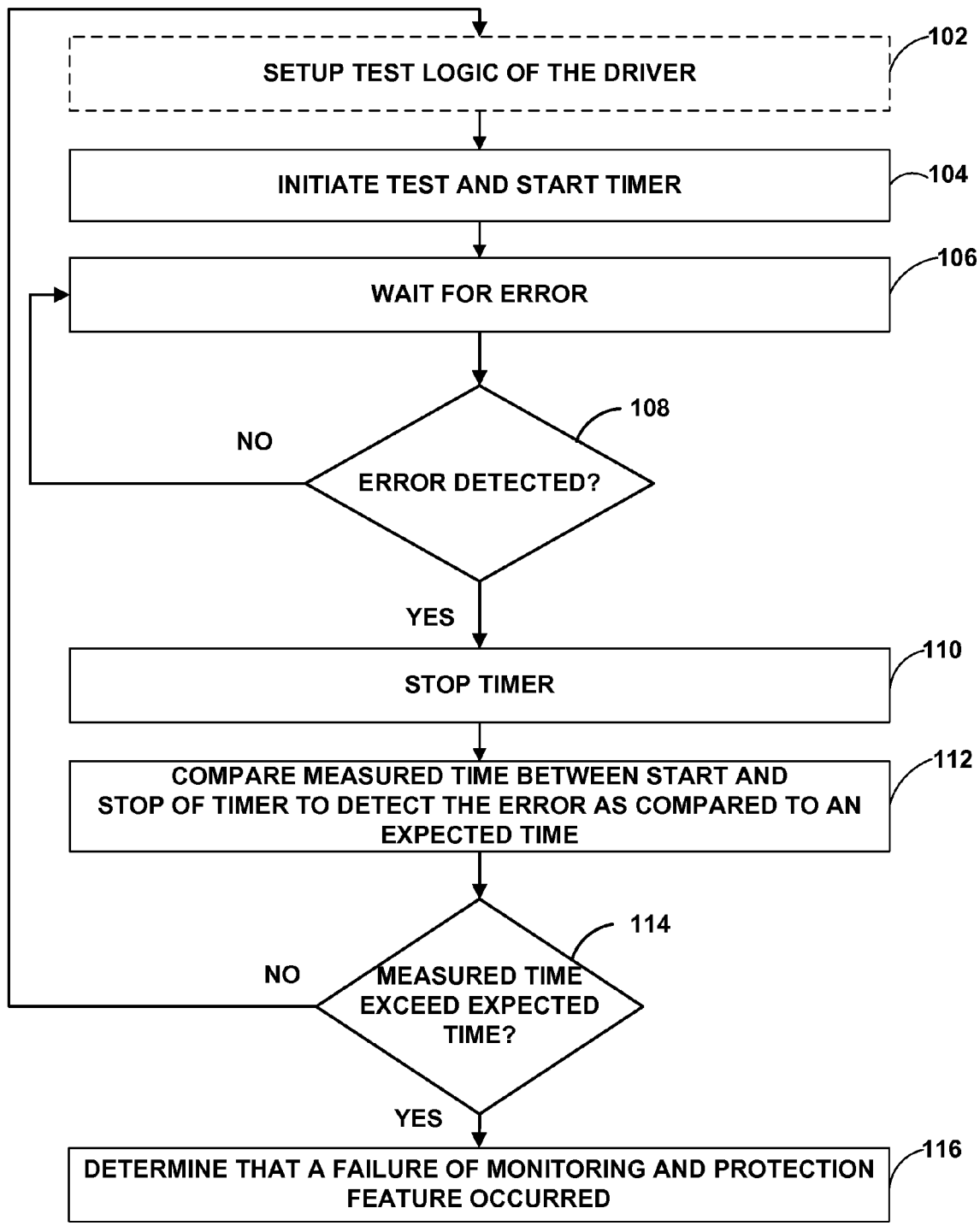
FIG. 2 is a flow chart illustrating example operations of an example control module for testing the internal monitoring and protection logic of an example gate driver, in accordance with one or more aspects of the present disclosure.

FIG. 2 is a flow chart illustrating example operations of control module 12 for testing the internal monitoring and protection logic of driver 4, in accordance with one or more aspects of the present disclosure. FIG. 2 is described below within the context of system 1 of FIG. 1.

In order to test the monitoring and protection features of driver 4, at least one processor of control module 12 may be configured to perform operations 102-116. For example, control module 12 may include a non-transitory storage medium comprising instructions that when executed, configure at least one processor of control module 12 to perform operations 102-116.

In operation, control module 12 may initially setup the test logic of driver 4 (102) so as to initiate driver 4 to perform tests of the monitoring and protection features of driver 4. In some examples, the set up of driver 4 may occur prior to each test. In some examples, the setup of driver 4 may occur at a factory or manufacturing facility of driver 4. In some examples, the setup of driver 4 may occur during installation of driver 4 and/or system 1 in a larger system. In some examples, the setup of driver 4 may occur at each power up of system 1 (e.g., each time system 1 transitions from operating in a no-power or low power state to operating in a full-power or other operational state).

In some examples, in setting up the test logic of driver 4, control module 12 may set up a defined blanking window associated with driver 4. The defined blanking window may specify a time that GSM module 6 is to wait before reporting whether a failure condition at link 20 has occurred. In other words, the defined blanking time may correspond to an initial count or maximum count associated with blanking counter 9 of GSM module 6. Again, one purpose of blanking counter 9 is to provide monitor module 8 with sufficient amount of time to determine whether device 14 is experiencing a failure condition, before GSM module 6 analyzes the information received from monitor module 8 for any detected failures. In other words, blanking counter 9 prevents errors from erroneously being received by GSM module 6 during a transition phase of gate control signal at link 16B when monitor module 8 may not necessarily be accurately detecting failure conditions.

In some examples, in setting up the test logic of driver 4, control module 12 may set up a defined test threshold voltage associated with driver 4. The defined test threshold voltage may for example, be used by desaturation monitoring features of driver 4 to determine whether desaturation at link 20 has occurred. For example, during normal operation (not during a test of monitor module 8), desaturation monitoring features of monitor module 8 may compare the voltage at link 20 to the defined threshold voltage to determine whether desaturation has occurred. During test operations, (during a test of monitor module 8), desaturation monitoring features of monitor module 8 may flag a desaturation error if the voltage at link 20 exceeds a lower, voltage threshold.

In any case, after setting up the test logic of driver 4, control module 12 may initiate a test of driver 4 and start a timer used to measure the duration of the test (104). For example, control module 12 may send a signal via link 16C to test module 10 that causes test module 10 to simulate a failure condition at link 20. Control module 12 may initiate the test of driver 4 occasionally, for instance, prior to start-up of system 1 (e.g., before sending electrical power to an engine of an automobile). In some examples, link 16C is a "static" or dedicated line for transmitting, from control module 12, a test indication/enable signal.

Blanking counter 9 does not depend on the test signal at link 16C. Blanking counter 9 is initiated or reset upon the gate control signal at link 16B transitioning from off to on. When blanking counter 9 is reset during the off/on transition of the gate control signal, the test of driver 4 begins.

As blanking counter 9 is counting, control module 12 may wait for an error to be detected (106/108). For example, control module 12 may poll link 16A until GSM module 6 of driver 4 reports an error condition in response to the simulated failure condition being caused by test module 10. If an error is reported at link 16A by driver 4, control module 12 may stop the timer being used to measure the duration of the test (110). Otherwise, if no error is reported at link 16A, control module 12 may continue to wait for the error to be reported at link 16A.

Control module 12 may stop the timer used to measure the duration of the test (110) and use the measured duration of the test to determine whether the failure monitoring and protection features of driver 4 are performing correctly. Control module 12 may compare the measured time to an expected time (112). For example, the expected time may be an average time or average range of times that driver 4 typically takes to report a simulated failure condition.

Control module 12 may determine that if the measured time does not exceed the expected time that the monitoring and protection features of driver 4 are performing satisfactorily (114). However, in response to determining that the measured time exceeds the expected time (e.g., by a threshold amount), than control module 12 may determine that a failure of the monitoring and protection feature of driver 4 occurred (118). After failing a test, control module 12 may report an error with system 1 (e.g., by illuminating an engine light in a dash panel of an automobile). In this way, the failure monitoring and protection features of driver 4 can be tested occasionally (e.g., before sending electrical power to device 14 and/or other components of system 1, in other words, before an automobile engine is running) and without risking damage to system 1 by unnecessarily injecting a failure condition (e.g., an overcurrent or an overvoltage) at system 1.

Figure 3:
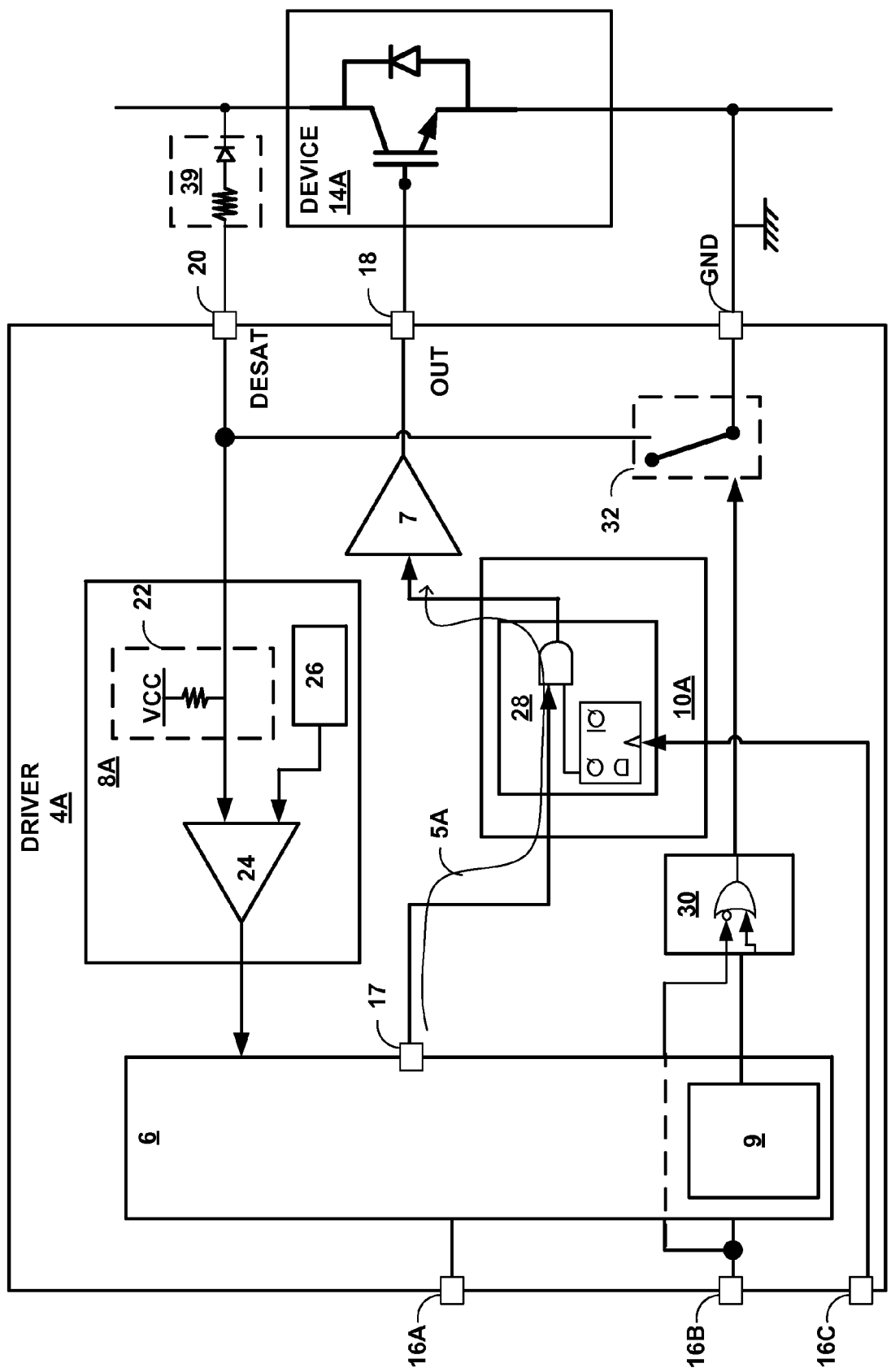
FIG. 3 is a conceptual diagram illustrating an example gate driver configured to test desaturation monitoring and protection logic of an example gate driver, in accordance with one or more aspects of the present disclosure.

FIG. 3 is a conceptual diagram illustrating driver 4A which is configured to test desaturation monitoring and protection logic of driver 4A, in accordance with one or more aspects of the present disclosure. Driver 4A is one example of driver 4 of system 1 and is described below within the context of system 1 of FIG. 1. Driver 4A includes gate signal module 6, buffer 7, test module 10A, monitor module 8A, switch 32, and element 30.

Driver 4A is coupled to device 14A which in this case is an IGBT power module. The gate of device 14A is coupled to the output of driver 4A at link 18. The desaturation pin of driver 4A is coupled, via resistor diode circuit 39, to the collector terminal or input of device 14A at link 20. The emitter terminal or output of device 14A is coupled to the GND terminal of driver 4A at GND.

Monitor module 8A which provides desaturation monitoring for device 14A at link 20. Monitor module 8A includes comparator 24, programmable threshold 26, and pull-up resistor 22.

One input of comparator 24 may be coupled to programmable threshold 26 (e.g., a digital-to-analog input, a register, or other element for storing a voltage threshold value). The other input of comparator 24 of monitor module 8A may be coupled to link 20 and pull-up resistor 22. Pull-up resistor 22 is coupled to VCC. During a test of monitor module 8A, link 20 is momentarily coupled to GND via switch 32 (e.g., a clamping transistor). The output of comparator 24 feeds GSM module 6 with information about whether the voltage at the desaturation pin of driver 4A is saturated or not.

Switch 32 may in some examples be a clamping transistor. Switch 32 may not require any special test mode for activation. In other words, switch 32 may be enabled, in normal operation: whenever information at link 16B indicates that device 4 is OFF or during a test, whenever blanking counter is counting. When enabled, switch 32 couples the desaturation pin of driver 4A to link 20 and GND Programmable threshold 26 represents a reference voltage for determining whether monitor module 8 is working properly. In some examples, the value of programmable threshold 26 may correspond to the expected voltage level at the desaturation pin of driver 4A. This expected voltage level, corresponds to the voltage level at the desaturation pin of driver 4A at a predefined time after link 20 has been de-coupled from GND (e.g., with the opening or disabling of switch 32) and allowed to rise with pull-up resistor 22. In some examples, control module 12 may vary the value of programmable threshold 26 to perform consistency checks of monitor module 8A to determine whether monitor module 8A is correctly reporting out desaturation errors at varying predefined times during a test after link 20 has been de-coupled from GND (e.g., with the opening or disabling of switch 32) and allowed to rise with pull-up resistor 22. Said differently, control module 12 may vary the value of programmable voltage threshold 26 to perform consistency checks against comparator 24 to determine whether the rise time associated with the desaturation pin of driver 4A changes accordingly.

Driver 4A also includes test module 10A. Test module 10A includes element 30 and element 28.

Element 30 is shown as including an OR gate with one input tied to the output of blanking counter 9 of GSM 6 and the other input being negated and coupled to link 16B. Other variations of element 30 exist. The purpose of element 30 is to enable or "close" switch 32 during normal and test operations, as well as to tie the desaturation pin of driver 4A at link 20 to GND during the "blanking period". That is, element 30 couples link 20 to GND during the period after blanking counter 9 is initialized, and until blanking counter 9 reaches a maximum count (i.e., counts down to zero or counts up to a maximum). Element 30 also causes switch 32 to couple the desaturation pin of driver 4A at link 20 to GND whenever the gate control signal at link 16B is low (e.g., "OFF"). After the blanking period is over, or when the gate control signal at link 16B is high (e.g., "ON"), element 30 disables or "opens" clamping element 32 so that the desaturation pin of driver 4A at link 20 is not coupled to GND, rather the desaturation pin is coupled to the input of device 14A for performing normal desaturation monitoring and protection operations.

Driver 4A also includes element 28 which is responsible for keeping driver 4A off and not letting a gate signal pass from link 17 to buffer 7, whenever test module 10A is conducting a test. In this way, operations of device 14A that are controlled by gate signals from driver 4A are inhibited (e.g., for safety) during a test of monitoring module 8A. In the example of FIG. 3, element 28 includes an AND gate and a D-type flip-flop. One input to the AND gate of element 28 is coupled to link 17 and the other input of the AND gate of element 28 is coupled to an output of the D-type flip-flop. The enable input of the D-type flip-flop of element 28 is coupled to link 16C. When element 28 is enabled by a signal at link 16C and configured to test monitor module 8A, element 28 prevents the creation of signal path 5A. When element 28 is disabled by a signal at link 16C and configured to refrain from testing monitor module 8A, element 28 allows the creation of signal path 5A so that a gate signal being output from GSM 6 can travel through link 17 and element 28 and out to buffer 7. Element 28 inhibits driver 4A from outputting a gate signal during a test of the desaturation monitoring and protection feature of driver 4A.

Monitor module 8A provides desaturation monitoring and protection by monitoring the voltage across the collector and emitter ($V_{CE}$) of device 14A and outputs an error signal to GSM module 6 if the voltage deviates from nominal. For example, monitor module may determine whether device 14A, when driven into an ON state, will be able to pull-down its collector to a near GND level. If a fault condition occurs (e.g. a short circuit to a power supply causing too much current), the fault condition may cause the collector of device 14A to remain high and not be pulled-down to a near GND level. In the event that the output of device 14A remains high, the desaturation pin of driver 4A at link 20 will also stay high (e.g., not being pulled down by the diode 39) and as such, comparator 24 will output an error signal.

Rather than inject an overcurrent at the input of device 14A to test whether the desaturation monitoring and protection feature provided by monitor module 8A is working, test module 10A can simulate a failure condition at link 20 to trick monitor module 8A into detecting a desaturation condition when monitor module 8A is working properly. If in response to the simulated failure condition, monitor module 8A correctly reports the desaturation condition to GSM module 6 and control module 12, control module 12 can validate that monitor module 8A is working properly.

Figure 4:
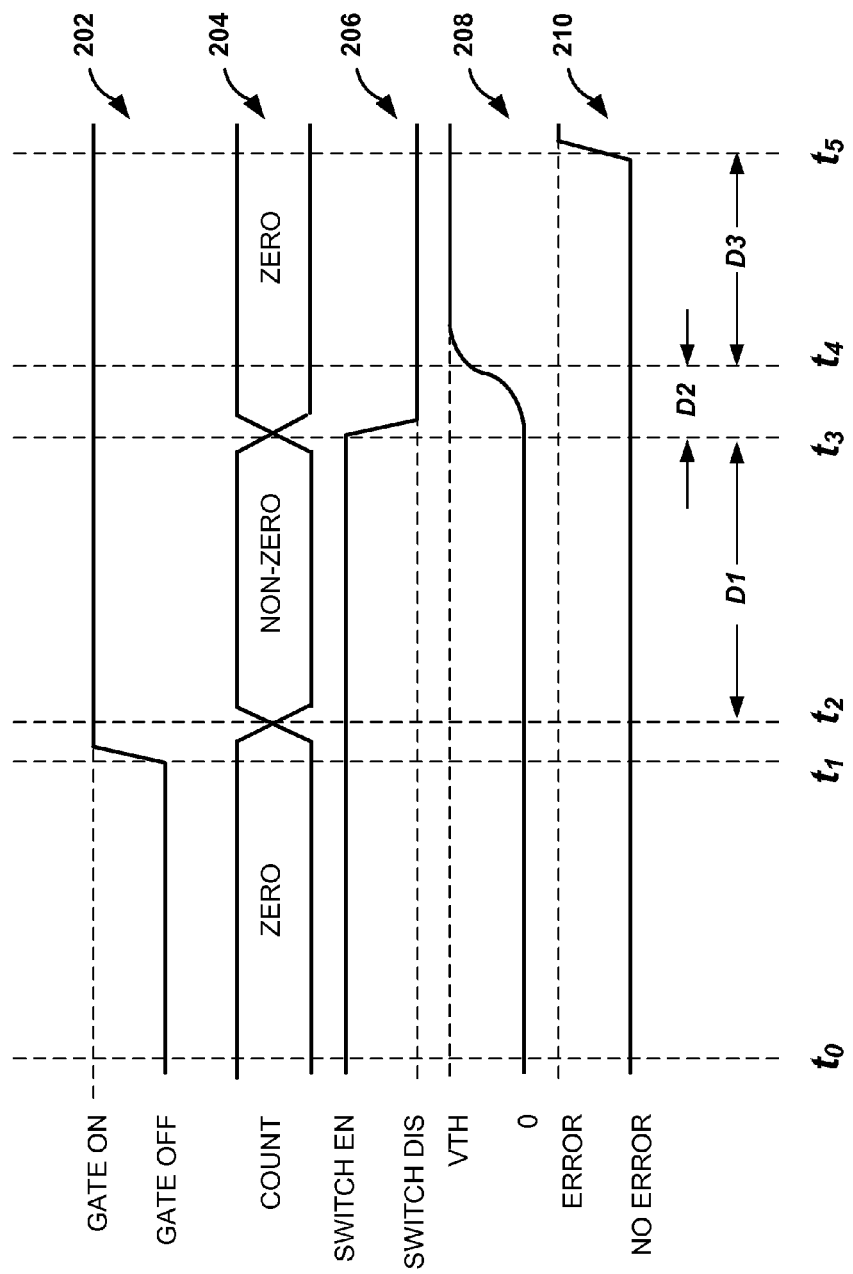
FIG. 4 is a waveform diagram illustrating example timing and electrical characteristics of the example gate driver of FIG. 3 while an example control module tests the desaturation monitoring and protection logic of an example gate driver, in accordance with one or more aspects of the present disclosure.

FIG. 4 is a waveform diagram illustrating example timing and electrical characteristics of driver 4A of FIG. 3 while control module 12 tests the desaturation monitoring and protection logic driver 4A, in accordance with one or more aspects of the present disclosure. FIG. 4 is described below in the context of FIGS. 1-3.

FIG. 4 illustrates waveforms 202-210 between times t0 and t5. Waveform 202 corresponds to the gate control signal at link 16B. Waveform 204 corresponds to the counter value at blanking counter 9 as blanking counter 9 counts down from a maximum count value to a zero count value. Waveform 206 represents the output from element 30 and waveform 208 represents the voltage at the desaturation pin of driver 4A at link 20. Lastly, waveform 210 represents the output of monitor module 8A and/or the error signal at link 16A.

At time t0, the gate control signal at link 16B may be low, causing element 30 to enable switch 32, and causing the voltage at the desaturation pin of driver 4A to be at zero volts. At time t0, blanking counter 9 has not been initialized and driver 4A is not outputting an error signal at link 16A.

At some point after time t0, control module 12 may initiate a test of the desaturation monitoring and protection features of driver 4A. Test module 10A may receive a signal from control module 12 via link 16C to initiate a test of monitor module 8A. The signal received via link 16C may enable element 28 of test module 10A and inhibit signal path 5A from forming between GSM 6 and buffer 7 (e.g., to prevent an erroneous gate signal at the gate terminal of device 14A during the test).

At time t1, when the gate control signal at link 16B transitions from low (e.g., off) to high (e.g., on), the transition may cause blanking counter 9 to initialize from a zero count value to a non-zero count value. At time t2, blanking counter 9 may begin to count down the blanking period. Duration D1 represents the blanking period during which switch 32 couples the desaturation pin of driver 4A to GND.

At time t3, blanking counter 9 reaches a zero count value and element 30 disables switch 32. Once disabled, the voltage level at the desaturation pin of driver 4A begins to rise from GND with a known RC time constant during duration D2, otherwise referred to as the "rise time" associated with the desaturation pin of driver 4A. In other words, the "rise time" is the amount of time that the voltage level at the desaturation pin of driver 4A takes to increase from GND to the value of programmable threshold 26 due to pull-up resistor 22.

At time t4, control module 12 may analyze the output from driver 4A at link 16A to determine whether GSM module 6 and comparator 24 of monitor module 8A are correctly reporting a desaturation error in response to the test. At time t5, control module 12 may first identify the desaturation error reported at link 16A. The time between time t4 and t5 corresponds to duration D3 and is referred to as the "reporting time." The reporting time is the time driver 4A takes to alert control module 12 to a detected desaturation error at link 20.

To determine whether the desaturation monitoring and protection logic driver 4A is working properly, control module 12 may determine whether the desaturation error reported at time t5, was reported in-time. That is, when causing driver 4A to execute a test of monitor module 8A, control module 12 may expect an error at link 16A to show up with sufficient delay (e.g., in the range D1+D2+D3); however, control module 12 may determine that if the error at 16A shows up too early, too late, or not at all, then something may not be working correctly with driver 4A and take action to prevent system 1 from utilizing driver 4A and/or device 14A.

Control module 12 may determine a difference between the measured total test time from t1 to t5 and an expected test time. By comparing the measured error signaling delay against the expected delay value, the complete desaturation monitoring and protection feature (including the functionality of blanking counter 9) can be verified. In some examples, control module 12 may vary the value of programmable voltage threshold 26 to perform consistency checks for comparator 24 to determine whether the rise time (duration D2) changes accordingly. In this way, a test of the desaturation monitoring and protection features of driver 4A can be performed without having to switch-on device 14A. The functionality of driver 4A can be verified and guaranteed to work before powering on device 14A.

Figure 5:
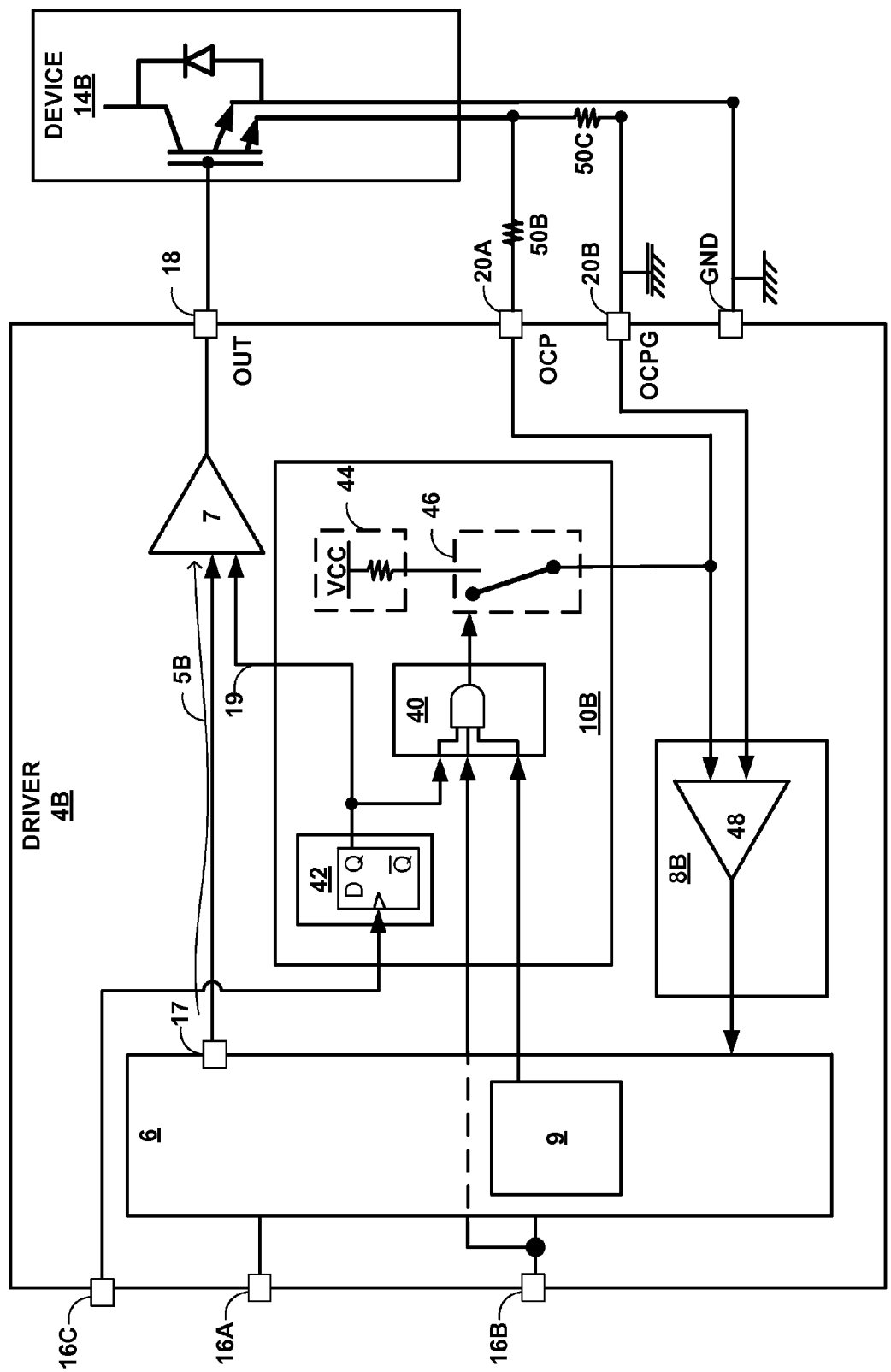
FIG. 5 is a conceptual diagram illustrating an example gate driver configured to test overcurrent monitoring and protection logic of an example gate driver, in accordance with one or more aspects of the present disclosure.

FIG. 5 is a conceptual diagram illustrating driver 4B which is configured to test overcurrent monitoring and protection logic of driver 4B, in accordance with one or more aspects of the present disclosure. Driver 4B is one example of driver 4 of system 1 and is described below within the context of system 1 of FIG. 1.

Driver 4B is coupled to device 14B which in this case is an IGBT power module with dual output or emitter terminals. The gate of device 14B is coupled to the output of driver 4B at link 18. The first output terminal of device 14B is coupled to the GND pin of driver 4B at GND. The second output terminal of device 14B is coupled, via resistors 50B and 50C, to the overcurrent protection pins of driver 4B at links 20A and 20B. In some examples, link 20B is connected on printed circuit board level to GND. That is, the overcurrent protection pin of driver 4B is coupled to the second output of device 14B via resistor 50B at link 20A. The overcurrent protection ground pin of driver 4B is coupled to the second output of device 14B via resistor 50C at link 20B. While FIG. 5 shows comparator 48 of device 4B as receiving both overcurrent protection pin and overcurrent protection GND pin inputs to enable the sensing of small voltages, in some examples, comparator 48 is a single ended comparator that compares overcurrent protection PIN to GND; in this case overcurrent protection GND pin may be eliminated.

Driver 4B includes monitor module 8B which provides overcurrent monitoring for device 14B at links 20A and 20B. Monitor module 8B provides overcurrent monitoring and protection by monitoring the current out of the emitter of device 14B and outputs an error signal to GSM module 6 if the current reaches a maximum. Monitor module 8B includes comparator 48.

As indicated above, in the case of comparator 48 being a differential comparator, as is shown in FIG. 5, one input of comparator 48 is coupled to the overcurrent protection ground pin of driver 4B at link 20B. The other input of comparator 48 is coupled to the overcurrent protection pin of driver 4B at link 20A and also to pull-up resistor 44 of test module 10B when switch 46 of test module 10B is enabled or closed. In the case of comparator 48 being a single ended comparator, the input of comparator 48 is coupled to the overcurrent protection pin of driver 4B at link 20A. The output of comparator 48 feeds GSM module 6 with information about whether an overcurrent condition exists at device 14B.

That is, monitor module 8B relies on comparator 48 to supervise the current level through device 14B and output an error signal when the current reaches a maximum current. Resistor 50C is a shunt or sense resistor with a resistance that is selected according to the maximum current device 14B is capable of handling. When the current out of device 14B is indicative of an overcurrent condition, the difference in voltage between the two inputs of comparator 48 rises above a defined threshold and triggers comparator 48 to flag the high current as a failure condition. After a blanking period, GSM module 6 may output the failure condition to control module 12 at link 16A. The blanking period may mask any overcurrent error erroneously being reported during the transition phase after device 14B switches-on.

Driver 4A also includes test module 10B. In addition to switch 46 which, when enabled, couples the overcurrent protection pin of driver 4B at link 20A to pull-up resistor 44, test module 10B includes element 40 and element 42.

Element 42 is shown in the example of FIG. 5 as a so-called "D-type" flip-flop, although other examples of element 42 exist. Element 42 is responsible for providing a test indication signal at link 19 to output buffer 7 (which in the example of FIG. 5, represents a dual input buffer) whenever test module 10B is conducting a test of the overcurrent monitoring and protection features of driver 4B. The test indication signal at link 19 may prevent output buffer 7 from executing a full turn ON of device 14B even if a gate signal appeared at link 17. In other words, the test indication signal at link 19 may cause driver 4B to execute a "weak" turn ON of device 14B or cause device 14B to stay OFF during a test. By providing an output at link 19, element 42 may cause buffer 7 to ignore link 17 (e.g., path 5B is disabled) during a test.

For example, in order to conduct a test of the overcurrent monitoring and protection features of driver 4B, driver 4B may stimulate device 14B to execute a "weak" turn ON. Device 14B will not switch ON strong enough to provide a signal that is of sufficient current to generate an output at links 20A and 20B. To cause output buffer 7 to provide a weak ON signal at link 18, control module 12 provides an enable signal at link 16C whenever control module 12 initiates a test. Element 42 samples link 16C and enables the test mode by activating a signal on link 19. In this way, driver 4B only outputs a weak on signal (i.e., less than full strength or otherwise with less current than the current of an actual gate signal), but not an actual, full strength gate signal, during a test of monitor module 8B so as to prevent a large current through device 14B. In some examples output buffer 7 may alternatively keep device 14B fully OFF during the test. The term "weak on or off" gate signal, as used herein, may have less current than a nominal gate signal used by a driver to hold a semiconductor device in an on-state or off-state at times other than during the test.

Element 40 is shown as including an AND gate with a first input tied to the output of blanking counter 9 of GSM 6, a second input coupled to link 16B, and a third input coupled to the output of element 42. Other variations of element 40 exist. The purpose of element 40 is to enable or "close" switch 46 and tie the overcurrent protection pin of driver 4B at link 20A to pull-up resistor 44 after the "blanking period" of a test of monitor module 8B; that is, element 40 couples link 20A to pull-up resistor 44 after blanking counter 9 reaches a final count (e.g., a maximum count when counting up or minimum count when counting down), and element 42 is enabled, and whenever the gate control signal at link 16B is high (e.g., "ON"). The test indication signal at link 19 forces buffer 7 to send a weak ON or stay fully OFF signal to 14B.

Rather than driving device 14B into an overcurrent condition to test whether the overcurrent monitoring and protection feature provided by monitor module 8B is working, test module 10B can simulate a failure condition at links 20A and 20B to trick monitor module 8B into detecting an overcurrent condition when monitor module 8B is working properly. Test module 10A can inject a simulated overcurrent condition at the overcurrent protection pin of driver 4B when switch 46 is closed. If in response to the simulated failure condition, monitor module 8B correctly reports the overcurrent condition to GSM module 6 and control module 12, control module 12 can validate that monitor module 8B is working properly.

Figure 6:
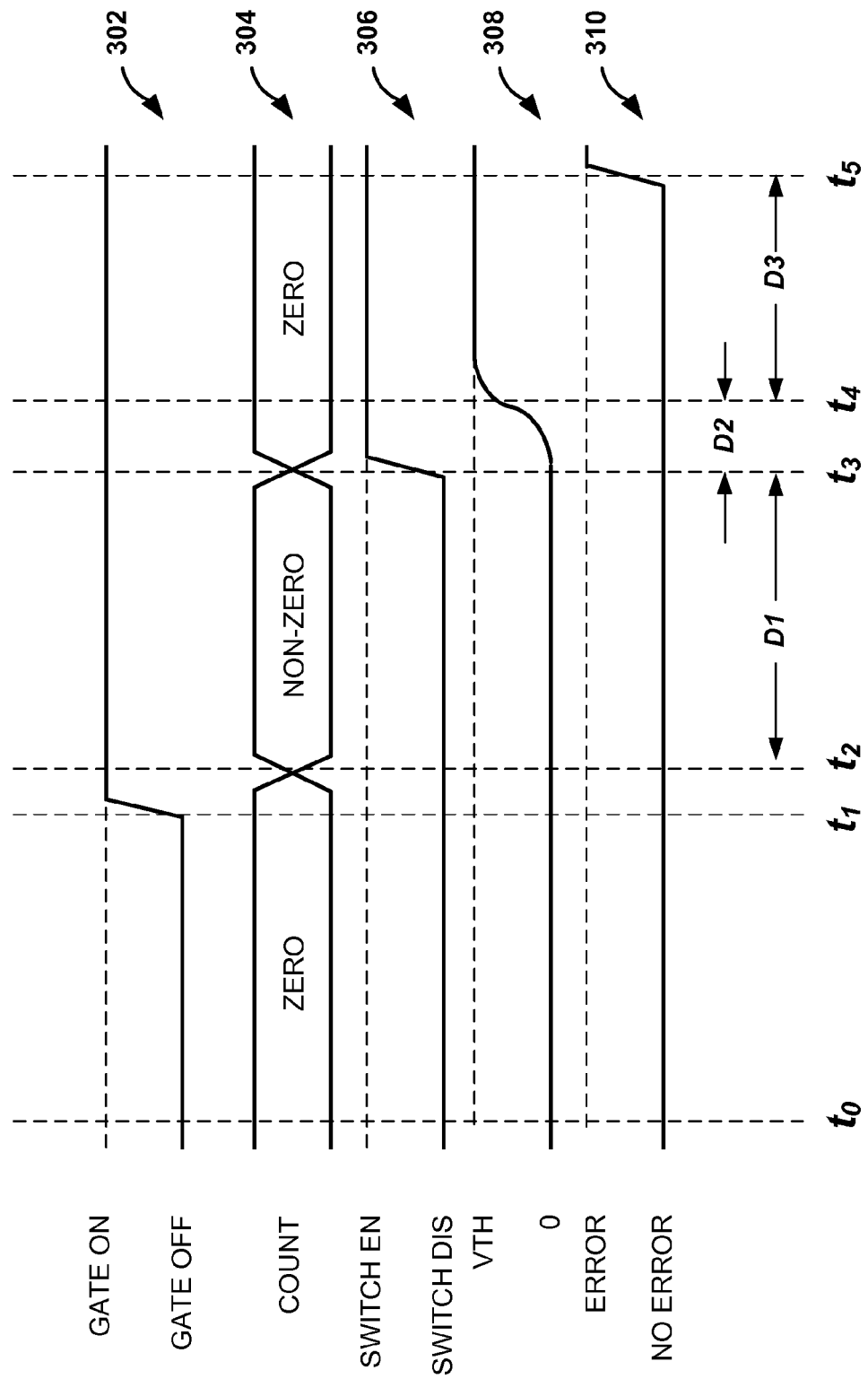
FIG. 6 is a waveform diagram illustrating example timing and electrical characteristics of the example gate driver of FIG. 5 while an example control module tests the overcurrent monitoring and protection logic of an example gate driver, in accordance with one or more aspects of the present disclosure.

FIG. 6 is a waveform diagram illustrating example timing and electrical characteristics of driver 4B of FIG. 5 while control module 12 tests the overcurrent monitoring and protection logic of driver 4B, in accordance with one or more aspects of the present disclosure. FIG. 6 is described below in the context of FIGS. 1, 2, and 4.

FIG. 6 illustrates waveforms 302-310 between times t0 and t5. Waveform 302 corresponds to the gate control signal at link 16B. Waveform 304 corresponds to the counter value at blanking counter 9 as blanking counter 9 counts down from a maximum count value to a zero count value. Waveform 306 represents the output from element 40 and waveform 308 represents the voltage at the overcurrent protection pin of driver 4B at link 20A. Lastly, waveform 310 represents the output of monitor module 8B and/or the error signal at link 16A.

At time t0, the gate control signal at link 16B may be low, causing element 40 to disable switch 46, and causing the voltage at the overcurrent protection pin of driver 4B to hover near or around zero volts or GND because of 50C pulling down to GND (e.g., at link 20B) during normal and test mode operations. At time t0, blanking counter 9 has not been initialized and driver 4B is not outputting an error signal at link 16A.

At some point after time t0, control module 12 may initiate a test of the overcurrent monitoring and protection features of driver 4B. Test module 10B may receive a signal from control module 12 via link 16C to initiate a test of monitor module 8B. The signal received via link 16C may enable element 42 of test module 10B to output a test indication signal at link 19. The test indication signal may cause buffer 7 to output a weak ON or stay fully OFF signal at the gate of device 14B at link 18.

At time t1, when the gate control signal at link 16B transitions from low (e.g., off) to high (e.g., on), the transition may cause blanking counter 9 to initialize from a zero count value to a non-zero count value. At time t2, blanking counter 9 may begin to count down the blanking period. Duration D1 represents the blanking period during which switch 46 refrains from coupling the overcurrent protection pin of driver 4B to pull-up resistor 44.

At time t2, blanking counter 9 reaches a final (e.g., zero) count value, the outputs from blanking counter 9, element 42, and at link 16B, cause element 40 to enable switch 46 at time t3. Once enabled, a small current enters pull-up resistor 44 from link 20A and the voltage level at the overcurrent protection pin of driver 4B at link 20A begins to rise from GND with a known RC time constant during duration D2, otherwise referred to as the "rise time" associated with the overcurrent protection pin of driver 4B. In other words, the "rise time" is the amount of time that the voltage level at the overcurrent protection pin of driver 4B takes to increase from GND to a voltage threshold associated with test module 10B.

At time t4, control module 12 may analyze the output from driver 4B at link 16A to determine whether GSM module 6 and comparator 48 of monitor module 8B are correctly reporting an overcurrent error in response to the test. At time t5, control module 12 may first identify the overcurrent error reported at link 16A. The time between time t4 and t5 corresponds to duration D3 and is referred to as the "reporting time." The reporting time is the time driver 4B takes to alert control module 12 to a detected overcurrent error at link 20A.

To determine whether the overcurrent monitoring and protection logic driver 4B is working properly, control module 12 may determine whether the overcurrent error reported at time t5, was reported in-time. That is, when causing driver 4B to execute a test of monitor module 8B, control module 12 may expect an error at link 16A to show up with sufficient delay (in the range D1+D2+D3). However, control module 12 may determine that if the error at 16A shows up too early, too late, or not at all, then something may not be working correctly with driver 4B and control module 12 may take action to prevent system 1 from utilizing driver 4B and/or device 14B.

Control module 12 may determine a difference between the measured total test time from t1 to t5 and an expected test time. By comparing the measured error signaling delay against the expected delay value, the complete overcurrent monitoring and protection feature (including the functionality of blanking counter 9) can be verified. In this way, a test of the overcurrent monitoring and protection features of driver 4B can be performed without having to switch-on device 14B and potentially causing high currents and threatening safety. The functionality of driver 4B can be verified and guaranteed to work before powering on device 14B.

Clause 1. A gate driver comprising: a gate signal module configured to output a gate signal of the gate driver for driving a gate terminal of a semiconductor device; a test module configured to generate a simulated failure condition at a semiconductor device during a test of a monitoring and protection feature of the gate driver; and a monitor module configured to output an indication of the simulated failure condition in response to detecting the simulated failure condition at the semiconductor device.

Clause 2. The gate driver of clause 1, further comprising: a blanking counter configured to delay the outputting of the indication of the simulated failure condition for at least a transition phase of a gate control signal received by the gate signal module from a control module.

Clause 3. The gate driver of any of clauses 1-2, wherein the monitor module is a desaturation type monitoring and protection feature of the gate driver and is further configured to output an indication of a desaturation condition associated with the semiconductor device that the monitor module detects at a desaturation pin of the gate driver.

Clause 4. The gate driver of clause 3, further comprising a switch, wherein the test module is configured to generate the simulated failure condition by at least: closing the switch to clamp the desaturation pin of the gate driver to ground level during a blanking period of the test of the monitoring and protection feature of the gate driver; and opening the switch after the blanking period of the test of the monitoring and protection feature of the gate driver.

Clause 5. The gate driver of clause 4, wherein the monitor module comprises a pull-up resistor coupled to the desaturation pin of the gate driver and configured to increase a voltage at the desaturation pin from ground to a voltage threshold after the test module opens the switch after the blanking period of the test of the monitoring and protection feature of the gate driver.

Clause 6. The gate driver of any of clauses 3-5, wherein the test module is further configured to generate the simulated failure condition by at least inhibiting the gate driver from outputting a gate signal to the semiconductor device during the test of the monitoring and protection feature of the gate driver.

Clause 7. The gate driver of any of clauses 1-2, wherein the monitor module is an overcurrent type monitoring and protection feature of the gate driver and is further configured to output an indication of an overcurrent condition associated with the semiconductor device that the monitor module detects at an overcurrent protection pin of the gate driver.

Clause 8. The gate driver of clause 7, further comprising a switch, wherein the test module is configured to generate the simulated failure condition by at least: generating a weak on or off signal for output to the semiconductor device during the test of the monitoring and protection feature of the gate driver, wherein the weak on or off gate signal has less current than a nominal gate signal that holds the semiconductor device in an on-state or off-state at times other than during the test; opening the switch before and during a blanking period of the test of the monitoring and protection feature of the gate driver to maintain the overcurrent protection pin of the gate driver at a ground level; closing the switch to clamp the overcurrent protection pin of the gate driver to a voltage threshold after the blanking period of the test of the monitoring and protection feature.

Clause 9. The gate driver of clause 8, wherein the test module comprises a pull-up resistor coupled to VCC, wherein closing the switch to clamp the overcurrent protection pin of the gate driver to the voltage threshold after the blanking period of the test of the monitoring and protection feature comprises coupling the overcurrent protection pin to the pull-up resistor via the switch.

Clause 10. The gate driver of any of clauses 1-9, wherein the semiconductor device is a power switch comprising at least one metal-oxide-semiconductor field-effect-transistor device or insulated-gate bipolar transistor device.

Clause 11. The gate driver of any of clauses 1-10, wherein the monitor module is further configured to output an indication of an actual failure condition not attributed to the test module in response to detecting the actual failure condition at the semiconductor device.

Clause 12. The gate driver of any of clauses 1-11, wherein the gate signal module is further configured to output the gate signal based on a control signal received by the gate driver from a control unit.

Clause 13. A method for testing of a monitoring and protection feature of a gate driver, the method comprising: initiating, by a control module, a test of the monitoring and protection feature of the gate driver during which the gate driver simulates a failure condition associated with a semiconductor device; responsive to receiving an indication of an error being output by the gate driver in response to the simulated failure condition, measuring, by the control module, an amount of time for the gate driver to output the indication of the error after initiating the test; comparing, by the control module, the measured amount of time to an expected time threshold; and responsive to determining the measured amount of time does not satisfy the expected time threshold, determining that a failure of the monitoring and protection feature of the gate driver occurred.

Clause 14. The method of clause 13, wherein the expected time threshold is based at least in part on a blanking period associated with the gate driver that prevents anomalies detected during the test from being output by the gate driver.

Clause 15. The method of clause 14, further comprising: outputting, by the control module, to the gate driver, a gate control signal, wherein the blanking period occurs after a transition phase of the gate control signal.

Clause 16. The method of any of clauses 13-15, wherein the monitoring and protection feature of the gate driver comprises an overcurrent type monitoring and protection feature of the gate driver.

Clause 17. The method of clause 16, wherein the expected time threshold is based at least in part on a rise time associated with a voltage level at an overcurrent protection pin of the gate driver, the rise time being an expected amount of time for the voltage level to increase from ground level to a voltage threshold due to a pull-up resistor associated with the gate driver after the overcurrent protection pin is pulled to the voltage threshold after initiation of the test.

Clause 18. The method of any of clauses 13-17, wherein the monitoring and protection feature of the gate driver comprises a desaturation type monitoring and protection feature of the gate driver.

Clause 19. The method of clause 18, wherein the expected time threshold is based at least in part on a rise time associated with a voltage level at a desaturation pin of the gate driver, the rise time being an expected amount of time for the voltage level to increase from ground level to a voltage threshold due to a pull-up resistor associated with the gate driver after the desaturation pin is pulled to ground following initiation of the test.

Clause 20. A computer-readable storage medium comprising instructions that, when executed, configure at least one processor of a control module to test a monitoring and protection feature of a gate driver by at least: initiating a test of the monitoring and protection feature of the gate driver during which the gate driver simulates a failure condition associated with a semiconductor device; responsive to receiving an indication of an error being output by the gate driver in response to the simulated failure condition, measuring an amount of time for the gate driver to output the indication of the error after initiating the test; comparing the measured amount of time to an expected time threshold; and responsive to determining the measured amount of time does not satisfy the expected time threshold, determining that a failure of the monitoring and protection feature of the gate driver occurred.

Clause 21. A system comprising at least one processor and at least one module operable by the at least one processor to perform any of the methods of clauses 13-19.

Clause 22. A system comprising means for performing any of the methods of clauses 13-19.

In one or more examples, the operations described may be implemented in hardware, software, firmware, or any combination thereof. If implemented in software, the operations may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:

1. A gate driver comprising:
 a gate signal module configured to:
  output a gate signal of the gate driver for driving a gate terminal of a semiconductor device based at least in part on an indication of whether any failure conditions are occurring at the semiconductor device;
 a test module configured to generate a simulated failure condition at the semiconductor device during a test of a monitoring and protection feature of the gate driver; and
 a monitor module configured to:
  output an indication of the simulated failure condition in response to detecting the simulated failure condition at the semiconductor device;
  determine whether any failure conditions are occurring at the semiconductor device; and
  output, to the gate signal module, the indication of whether any failure conditions are occurring at the semiconductor device.

2. The gate driver of claim 1, further comprising:
 a blanking counter configured to delay the outputting of the indication of the simulated failure condition for at least a transition phase of a gate control signal received by the gate signal module from a control module.

3. The gate driver of claim 1, wherein the monitor module is a desaturation type monitoring and protection feature of the gate driver and is further configured to output an indication of a desaturation condition associated with the semiconductor device that the monitor module detects at a desaturation pin of the gate driver.

4. The gate driver of claim 3, further comprising a switch, wherein the test module is configured to generate the simulated failure condition by at least:

closing the switch to clamp the desaturation pin of the gate driver to ground level during a blanking period of the test of the monitoring and protection feature of the gate driver; and opening the switch after the blanking period of the test of the monitoring and protection feature of the gate driver.

5. The gate driver of claim 4, wherein the monitor module comprises a pull-up resistor coupled to the desaturation pin of the gate driver and configured to increase a voltage at the desaturation pin from ground to a voltage threshold after the test module opens the switch after the blanking period of the test of the monitoring and protection feature of the gate driver.

6. The gate driver of claim 3, wherein the test module is further configured to generate the simulated failure condition by at least inhibiting the gate driver from outputting a gate signal to the semiconductor device during the test of the monitoring and protection feature of the gate driver.

7. The gate driver of claim 1, wherein the monitor module is an overcurrent type monitoring and protection feature of the gate driver and is further configured to output an indication of an overcurrent condition associated with the semiconductor device that the monitor module detects at an overcurrent protection pin of the gate driver.

8. The gate driver of claim 7, further comprising a switch, wherein the test module is configured to generate the simulated failure condition by at least:
generating a weak on or off gate signal for output to the semiconductor device during the test of the monitoring and protection feature of the gate driver, wherein the weak on or off gate signal has less current than a nominal gate signal that holds the semiconductor device in an on-state or off-state at times other than during the test;
opening the switch before and during a blanking period of the test of the monitoring and protection feature of the gate driver to maintain the overcurrent protection pin of the gate driver at a ground level; and
closing the switch to clamp the overcurrent protection pin of the gate driver to a voltage threshold after the blanking period of the test of the monitoring and protection feature.

9. The gate driver of claim 8, wherein the test module comprises a pull-up resistor coupled to VCC, wherein closing the switch to clamp the overcurrent protection pin of the gate driver to the voltage threshold after the blanking period of the test of the monitoring and protection feature comprises coupling the overcurrent protection pin to the pull-up resistor via the switch.

10. The gate driver of claim 1, wherein the semiconductor device is a power switch comprising at least one metal-oxide-semiconductor field-effect-transistor device or insulated-gate bipolar transistor device.

11. The gate driver of claim 1, wherein the monitor module is further configured to output an indication of an actual failure condition not attributed to the test module in response to detecting the actual failure condition at the semiconductor device.

12. The gate driver of claim 1, wherein the gate signal module is further configured to output the gate signal based on a control signal received by the gate driver from a control unit.

13. A method for testing of a monitoring and protection feature of a gate driver, the method comprising:
initiating, by a control module, a test of the monitoring and protection feature of the gate driver during which a test module of the gate driver simulates a failure condition associated with a semiconductor device, wherein a gate signal module of the gate driver outputs a gate signal of the gate driver for driving a gate terminal of a semiconductor device based at least in part on an indication of whether any failure conditions are occurring at the semiconductor device, and a monitor module of the gate driver outputs an indication of the simulated failure condition in response to detecting the simulated failure condition at the semiconductor device, determines whether any failure conditions are occurring at the semiconductor device, and outputs the indication of whether any failure conditions are occurring at the semiconductor device;
responsive to receiving an indication of an error being output by the gate driver in response to the simulated failure condition, measuring, by the control module, an amount of time for the gate driver to output the indication of the error after initiating the test;
comparing, by the control module, the measured amount of time to an expected time threshold; and
responsive to determining the measured amount of time does not satisfy the expected time threshold, determining that a failure of the monitoring and protection feature of the gate driver occurred.

14. The method of claim 13, wherein the expected time threshold is based at least in part on a blanking period associated with the gate driver that prevents anomalies detected during the test from being output by the gate driver.

15. The method of claim 14, further comprising:
outputting, by the control module, to the gate driver, a gate control signal, wherein the blanking period occurs after a transition phase of the gate control signal.

16. The method of claim 13, wherein the monitoring and protection feature of the gate driver comprises an overcurrent type monitoring and protection feature of the gate driver.

17. The method of claim 16, wherein the expected time threshold is based at least in part on a rise time associated with a voltage level at an overcurrent protection pin of the gate driver, the rise time being an expected amount of time for the voltage level to increase from ground level to a voltage threshold due to a pull-up resistor associated with the gate driver after the overcurrent protection pin is pulled to the voltage threshold after initiation of the test.

18. The method of claim 13, wherein the monitoring and protection feature of the gate driver comprises a desaturation type monitoring and protection feature of the gate driver.

19. The method of claim 18, wherein the expected time threshold is based at least in part on a rise time associated with a voltage level at a desaturation pin of the gate driver, the rise time being an expected amount of time for the voltage level to increase from ground level to a voltage threshold due to a pull-up resistor associated with the gate driver after the desaturation pin is pulled to ground following initiation of the test.

20. A method performed by a gate driver for driving a gate terminal of a semiconductor device, the method comprising:
generating, by a test module of the gate driver, a simulated failure condition at the semiconductor device during a test of a monitoring and protection feature of the gate driver;
outputting, by a monitor module of the gate driver, an indication of the simulated failure condition in response to detecting the simulated failure condition at the semiconductor device;
in response to detecting the simulated failure condition at the semiconductor device, determining, by the monitor module, whether any actual failure conditions are occurring at the semiconductor device;

outputting, by the monitor module, to a gate signal module of the gate driver, an indication of whether any actual failure conditions are occurring at the semiconductor device; and outputting, by the gate signal module, based at least in part on the indication output by the monitor module as to whether any actual failure conditions are occurring at the semiconductor device, a gate signal for driving the gate terminal of the semiconductor device.

* * * * *